United States Patent
Khan et al.

(10) Patent No.: US 6,821,857 B1
(45) Date of Patent: Nov. 23, 2004

(54) HIGH ON-CURRENT DEVICE FOR HIGH PERFORMANCE EMBEDDED DRAM (EDRAM) AND METHOD OF FORMING THE SAME

(75) Inventors: Babar A. Khan, Ossining, NY (US); Rama Divakaruni, Ossining, NY (US); Subramanian S. Iyer, Mount Kisco, NY (US); Tzyy-Ming Cheng, Hsinchu (TW)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/458,413

(22) Filed: Jun. 10, 2003

(51) Int. Cl.[7] .............................................. H01L 21/336
(52) U.S. Cl. ...................... 438/296; 438/217; 438/218; 438/246; 438/248; 438/289; 257/510; 257/68; 257/296; 257/394
(58) Field of Search ................................ 438/296, 217, 438/218, 246, 248, 289, 142, 978; 257/510, 620, 68, 71, 296, 394–397

(56) References Cited

U.S. PATENT DOCUMENTS

| 5,436,488 A | 7/1995 | Poon et al. .................. 257/397 |
| 5,521,422 A | 5/1996 | Mandelman et al. ........ 257/510 |
| 5,741,738 A | 4/1998 | Mandelman et al. ........ 438/296 |
| 5,874,317 A | * 2/1999 | Stolmeijer .................. 438/296 |
| 5,913,132 A | * 6/1999 | Tsai ............................ 438/434 |
| 6,084,276 A | * 7/2000 | Gambino et al. ........... 257/397 |
| 6,322,634 B1 | 11/2001 | Pan ............................ 148/33.3 |

FOREIGN PATENT DOCUMENTS

JP   2000269484 A   *  9/2000

* cited by examiner

Primary Examiner—Nathan J. Flynn
Assistant Examiner—Remmon R. Fordé
(74) Attorney, Agent, or Firm—Lisa U. Jaklitsch; Cantor Colburn LLP

(57) ABSTRACT

A method for enhancing the on-current carrying capability of a MOSFET device is disclosed. In an explanary embodiment, the method includes recessing fill material formed within a shallow trench isolation (STI) adjacent the MOSFET so as to expose a desired depth of a sidewall of the STI, thereby increasing the effective size of a parasitic corner device of the MOSFET. The threshold voltage of the parasitic corner device is then adjusted so as to substantially equivalent to the threshold voltage of the MOSFET device.

6 Claims, 2 Drawing Sheets

HIGH ON-CURRENT DEVICE FOR HIGH PERFORMANCE EMBEDDED DRAM (EDRAM) AND METHOD OF FORMING THE SAME

BACKGROUND

The present invention relates generally to semiconductor device manufacturing and, more particularly, to an embedded dynamic random access (eDRAM) device having a high on-current for high performance thereof.

In the integrated circuit (IC) industry,.-manufacturers have been embedding dynamic random access memory (DRAM) arrays on the same substrate as microprocessor cores or other logic devices. This technology is commonly referred to as embedded DRAM (eDRAM). Embedded DRAM provides microcontrollers and other logic devices with faster access to larger capacities of on-chip memory at a lower cost than other currently available systems having conventional embedded static random access memory (SRAM) and/or electrically erasable programmable read only memory (EEPROM).

At the same time, the semiconductor industry continually strives to increase semiconductor device performance and density by miniaturizing the individual semiconductor components and by miniaturizing the overall semiconductor device dimensions. For example, the semiconductor device density can be increased by more densely integrating the components on the semiconductor chip. However, increasing integration densities by placing the individual circuit elements in closer proximity increases the potential for interactions between the circuit elements. Therefore, it has become necessary to include isolation structures to prevent any significant interaction between circuit elements on the same chip.

Contemporary CMOS technologies generally employ field effect transistors that are adjacent or bounded by trenches. These trenches provide isolation (shallow trench isolation or "STI") for the semiconductor devices. As is known in the art, the close proximity of each semiconductor device to an edge or corner of the trench may create parasitic leakage paths. These parasitic leakage paths result from an enhancement of the gate electric field near the trench corners, the gate electric field in turn being enhanced by the trench corner's small radius of curvature and the proximity of the gate conductor. As a result of the enhanced gate electric field, the trench corner has a lower threshold voltage ($V_t$) than the planar portion of the device.

Ideally, in an eDRAM device, the DRAM is embedded within the logic without affecting the performance of the logic device. However, as a practical matter, there are device design constraints imposed by the logic processing steps, such as relating to spacer and oxide thicknesses. These processes are kept preferably the same for the DRAM, so that the manufacturing costs of the eDRAM may be minimized. At the same time, the eDRAM should include a high performance DRAM, meaning that the on-current of the DRAM devices should remain high, (even as device dimensions shrink), without compromising the device off-current. Unfortunately, this becomes more and more difficult as cell and device size shrinks. In particular, the reduced diffusion width of the DRAM devices in succeeding technologies has a proportionate impact (i.e., a decrease) on the device on-current. Accordingly, it is desirable to be able to fabricate a reduced width eDRAM device that is still a high-performance device by having a relatively high on-current capability.

SUMMARY

The foregoing discussed drawbacks and deficiencies of the prior art are overcome or alleviated by a method for enhancing the on-current carrying capability of a MOSFET device. In an exemplary embodiment, the method includes recessing fill material formed within a shallow trench isolation (STI) adjacent the MOSFET so as to expose a desired depth of a sidewall of the STI, thereby increasing the effective size of a parasitic corner device of the MOSFET. The threshold voltage of the parasitic corner device is then adjusted so as to be substantially equivalent to the threshold voltage of the MOSFET device.

In another aspect, a semiconductor device includes a MOSFET disposed adjacent a shallow trench isolation (STI). The MOSFET includes a gate oxide layer formed over an active device area and a corner region defined by the STI, the STI further having a sufficient amount of fill material therein removed so as to allow the formation of the gate oxide layer to increase the effective size of a parasitic corner device. The corner region is further implanted with a dopant so as to adjust the threshold voltage of the parasitic corner device to be substantially equivalent to the threshold voltage of the MOSFET.

In yet another aspect, an embedded, dynamic random access memory (eDRAM) device includes an array of memory storage devices associated with a plurality of MOSFET devices for accessing the memory storage devices, wherein each of the MOSFET devices is disposed adjacent a shallow trench isolation (STI). Further, each of the MOSFET devices includes a gate oxide layer formed over an active device area and a corner region defined by the STI. The STI has a sufficient amount of fill material therein removed so as to allow the formation of the gate oxide layer to increase the effective size of a parasitic corner device. The corner region is further implanted with a dopant so as adjust the threshold voltage of the parasitic corner device to be substantially equivalent to the threshold voltage of the MOSFET.

BRIEF DESCRIPTION OF THE DRAWINGS

Referring to the exemplary drawings wherein like elements are numbered alike in the several FIGS.

DETAILED DESCRIPTION

Disclosed herein is an embedded DRAM device (and method of forming the same) having an increased on-current without physically increasing the cell size thereof. Briefly stated, the present disclosure effectively creates a "wider" device by deliberately increasing the size of a parasitic device, thereby allowing for an increased on-current of the regular channel DRAM device. The threshold voltage of this larger device is then adjusted so as to be compatible with (and become a part of) the channel device.

As opposed to conventional processes, the present disclosure does not seek to reduce, suppress or eliminate the effects of the parasitic corner device. Rather, the size and current carrying capability of the parasitic corner device is actually enhanced (and threshold voltage thereof is also adjusted) so as to increase the current carrying capability of the channel device. Thus, for example, as diffusion widths shrink below 0.14 $\mu$m, an equivalent corner device which is 0.03 $\mu$m wide can actually increase the effective device width to about 0.2 $\mu$m, thereby allowing for substantially higher on-currents and device performance without increasing the cell area.

Figure 1:
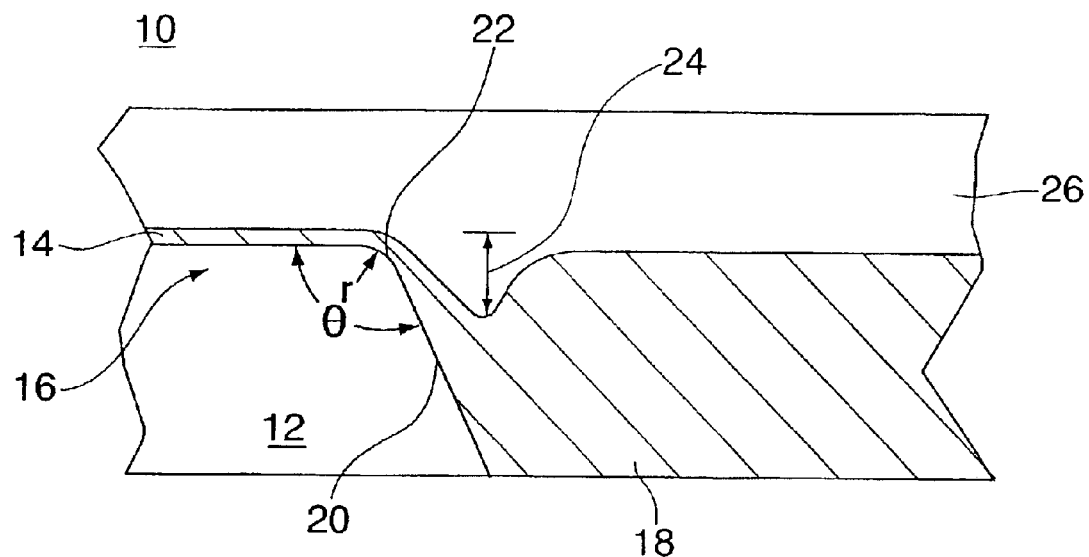
FIG. 1 is a sectional view of a MOSFET device having a parasitic corner device as result of conventional shallow trench isolation (STI) formation techniques.

Referring initially to FIG. 1, there is shown a sectional view of a MOSFET device 10 having a parasitic corner device as result of conventional shallow trench isolation (STI) formation techniques. The MOSFET device 10 is formed on a lightly doped substrate 12, over which is formed a gate oxide layer 14 (or other suitable gate insulating material) above a channel 16. Adjacent the gate oxide layer 14 is an STI region 18 that is separated from the substrate 12 by a sidewall 20. The sidewall 20 forms a corner 22 having a radius "r" and a corner angle θ with respect to the lower surface of the gate oxide layer 14. To the right of the corner 22, there is shown a depression 24 formed in the surface of the STI region 18, thereby causing the gate to wrap around the corner 22 following the deposition of the doped polysilicon layer 26 that serves as the gate conductor.

Figure 2:
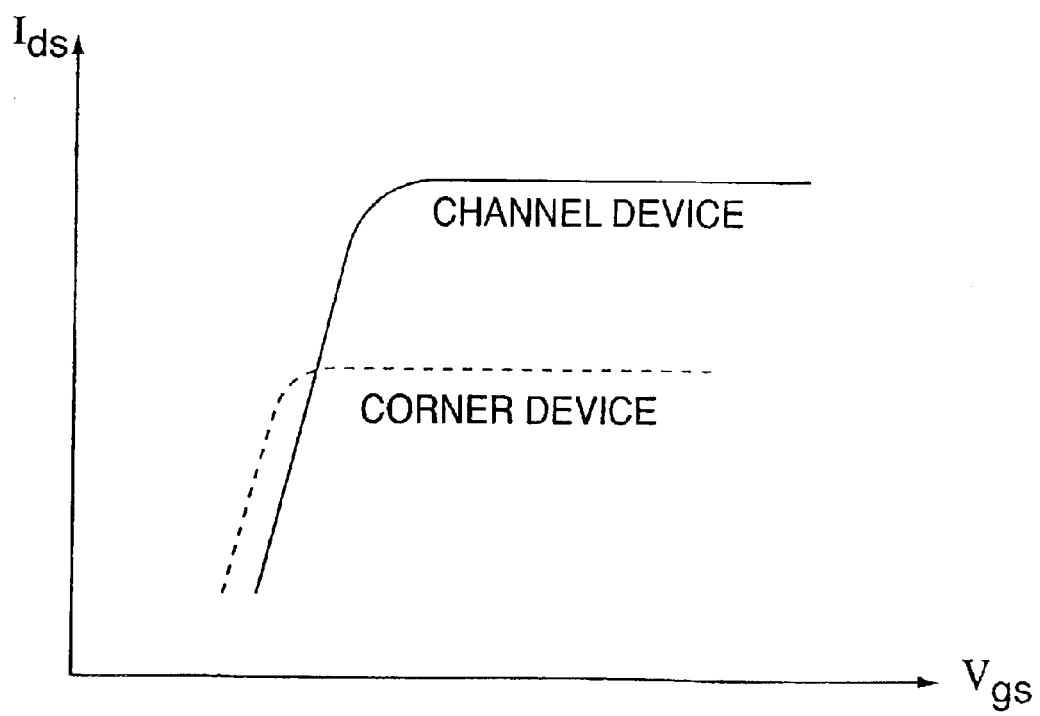
FIG. 2 is a graph illustrating characteristic current versus gate voltage curves for both the channel device and the parasitic corner device in the MOSFET of FIG. 1.

Because of the combination of the steep slope of the sidewall 20 and the depression 24, an applied gate voltage results in an enhanced electric field at the corner 22 of the active area Thus, this resulting corner device can lead to high off-currents and variations in the threshold voltage of the transistor, as the threshold voltage of the corner devices is lower than the threshold voltage of the main device. FIG. 2 is a graph illustrating characteristic current versus gate voltage curves for both the channel device and the corner device. As can be seen, the parasitic corner device (dashed curve) has a lower threshold voltage than the channel device (solid curve), thus leading to higher off-currents that are a component of the overall DRAM storage cell leakage. Moreover, the actual total device current will be the sum of the two device currents. Accordingly, the on-current contribution of a corner device in a conventional transistor will not be significant where the corner device width is relatively small.

As stated previously, existing processes have been directed toward minimizing the effects of the corner device, such as by ensuring that the top surface of the STI is above that of the silicon substrate, or by simply increasing the threshold voltage of the sidewall by implanting dopants therein. In contrast, the present invention embodiments use the corner device in an advantageous manner, as is described hereinafter in further detail.

Figure 3:
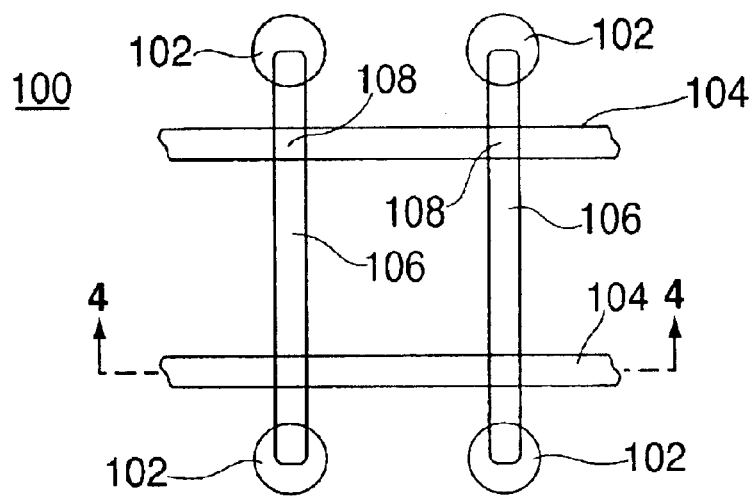
FIG. 3 is a plan view of a section of a semiconductor memory device, such as an eDRAM, suitable for use in accordance with an embodiment of the invention.
Figure 4:
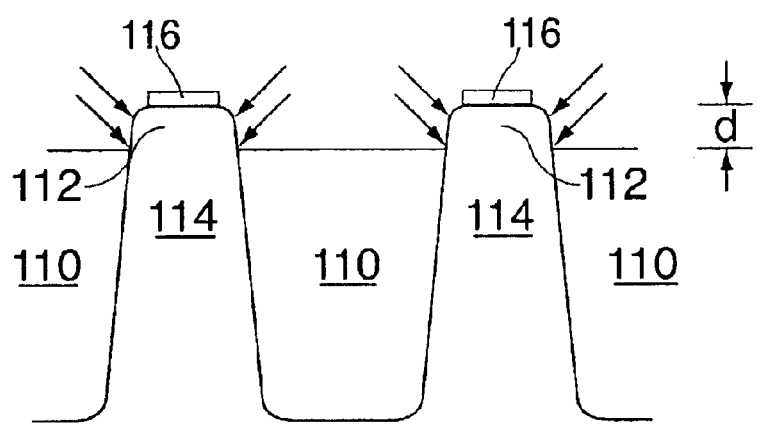
FIGS. 4 and 5 are sectional views, taken along the line 4—4 of FIG. 3, illustrating a method for enhancing the on-current of a MOSFET device, in accordance with an embodiment of the invention.
Figure 5:
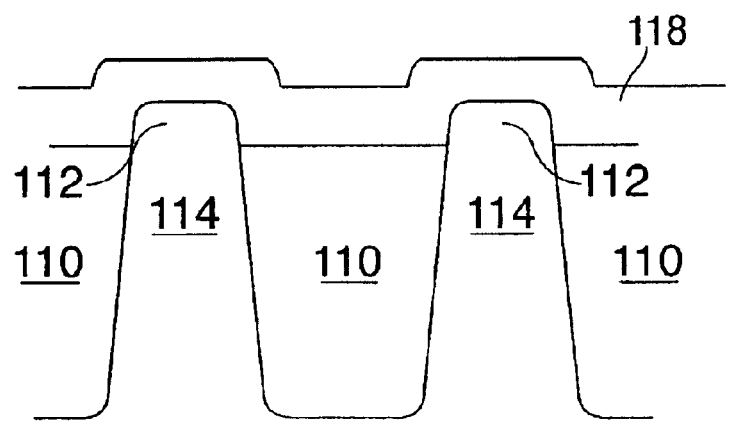

Referring generally now to FIGS. 3 through 5, there is shown an exemplary structure and method in which a larger corner device is fashioned for use in applications such as eDRAM. Those skilled in the art, however, will appreciate, that the device embodiments herein may be used in other suitable semiconductor applications. In particular, FIG. 3 is a top view of a section of eDRAM array 100 illustrating a plurality of deep trenches 102 (in which individual memory storage devices, i.e., capacitors, are formed), gate conductor lines 104, and active area diffusion regions 106. Those skilled in the art will recognize that the MOSFET gate stack devices are formed at the intersections 108 of the gate conductor lines 104 and the diffusion regions 106. The individual MOSFET devices formed by the gate stack devices and diffusion regions are used as access transistors for reading data from and writing data to the storage devices within the deep trenches 102. Elsewhere, the array 100 includes a plurality of shallow trench isolations (STIs) adjacent the active area diffusion regions 106, as is seen more particularly in FIGS. 4 and 5.

FIG. 4 is a sectional view of the eDRAM array 100, taken along the line 4—4 of FIG. 3. As can be seen, the STIs 110 are formed on opposing sides of the active areas of a given MOSFET device, including the channel regions 112 directly underneath the gate stack devices, and into the semiconductor substrate 114. As opposed to a conventional memory device or other semiconductor device, the STI oxide is etched down or recessed in a first etch step so as to expose an additional surface area of the substrate 114 adjacent the corner regions. Preferably, the first etch step is done just before a pad nitride 116 in the gate stack is removed. Alternatively, the first etch may also be selectively implemented in the array by using a block mask and photolithography techniques.

In either case, the STI oxide material is recessed to a sufficient depth "d" (up to, for example, about 1000Å) in order to accommodate an angled corner implantation step for the adjustment of the corner/sidewall device threshold voltage, indicated by the arrows in FIG. 4. Once the sidewalls are implanted, the gate polysilicon 118 is conformally deposited so as to wrap around the corners and a portion of the sidewalls, as seen in FIG. 5, thereby effectively creating a wider device having increased current on-current capability and with a consistent threshold voltage of the main device and the corner/sidewall device. As compared with the parasitic corner device illustrated in FIG. 1, the deliberately fabricated, wider parasitic device of the present disclosure takes advantage of both the corner region (see 22 of FIG. 1) and the sidewall region (see 20 of FIG. 1). Moreover, since both the corner and sidewall areas are implanted so as to result in a consistent threshold voltage, the combination thereof effectively serves a single, larger parasitic device than just a corner device.

In order to ensure that an adequate area of the exposed substrate sidewalls are exposed for the voltage threshold adjustment implantation step, the first etch may be carried out a greater depth than is actually desired for the poly-gate fill. After the implantation, the STI areas may be refilled with oxide material and then subsequently recessed with a second etch process to a shallower depth than for the first etch process, before then depositing the gate conductor material.

As will be appreciated, the above described method and structure allows for improved eDRAM performance by increasing the on-current capability of the main device without increasing the cell area of the MOSFET corner device is actually enhanced. So long as the threshold voltage of the enhanced parasitic corner devices is adjusted to be substantially equivalent to that of the main device, the parasitic device increases the current carrying capability of the channel device. Moreover, this is accomplished without a significant impact on device off-current.

While the invention has been described with reference to a preferred embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for enhancing the on-current carrying capability of a MOSFET device, the method comprising:

recessing fill material formed within a shallow trench isolation (STI) adjacent the MOSFET so as to expose a desired depth of a sidewall of the STI, thereby increasing the effective size of a parasitic corner device of the MOSFET; and adjusting the threshold voltage of said parasitic corner device so as to be substantially equivalent to the threshold voltage of the MOSFET device.

2. The method of claim 1, wherein said adjusting said threshold voltage of said parasitic corner device comprising implanting the exposed portions of said sidewall with a dopant material.

3. The method of claim 2, wherein said exposed portions of side wall are implanted with an angled implant.

4. The method of claim 1, wherein the effective size of said parasitic corner device is selected such that the magnitude of on-current of said parasitic corner device is substantially equivalent to the magnitude of on-current of the MOSFET device.

5. The method of claim 1, wherein said STI material is recessed by a first etch process, said first etch process being implemented before the removal of a pad nitride formed over an active area of a substrate in which the MOSFET is defined, and wherein said implanting is performed subsequent to said first etch process.

6. The method of claim 5, further comprising:

refilling said STI with additional said fill material;

performing a second etch in which a portion of the refilled STI is removed so as to effectively extend a gate insulator layer over said sidewall of said STI; and depositing a gate conductor layer over said gate insulator layer.

* * * * *